(12) United States Patent
Maayan et al.

(10) Patent No.: US 7,257,025 B2
(45) Date of Patent: *Aug. 14, 2007

(54) METHOD FOR READING NON-VOLATILE MEMORY CELLS

(75) Inventors: Eduardo Maayan, Kfar Saba (IL); Guy Cohen, Yaad (IL); Boaz Eitan, Ra'anana (IL)

(73) Assignee: Saifun Semiconductors Ltd, Netanya (IL)

( * ) Notice: Subject to any disclaimer, the term of this patent is extended or adjusted under 35 U.S.C. 154(b) by 11 days.

This patent is subject to a terminal disclaimer.

(21) Appl. No.: 11/007,332

(22) Filed: Dec. 9, 2004

(65) Prior Publication Data

US 2006/0126382 A1    Jun. 15, 2006

(51) Int. Cl.
*G11C 16/04*    (2006.01)

(52) U.S. Cl. .............................. 365/185.03; 365/185.2; 365/185.28; 365/185.29

(58) Field of Classification Search .......... 365/185.03, 365/185.2, 185.28, 185.29
See application file for complete search history.

(56) References Cited

U.S. PATENT DOCUMENTS

| | | |
|---|---|---|
| 4,342,102 A | 7/1982 | Puar |
| 4,388,705 A | 6/1983 | Sheppard |
| 4,389,705 A | 6/1983 | Sheppard |
| 5,027,321 A | 6/1991 | Park |
| 5,142,496 A | 8/1992 | Van Buskirk |
| 5,241,497 A | 8/1993 | Komarek |
| 5,276,646 A | 1/1994 | Kim et al. |
| 5,289,412 A | 2/1994 | Frary et al. |
| 5,305,262 A | 4/1994 | Yoneda |
| 5,335,198 A | 8/1994 | Van Buskirk et al. |
| 5,345,425 A | 9/1994 | Shikatani |
| 5,361,343 A | 11/1994 | Kosonocky et al. |
| 5,381,374 A | 1/1995 | Shiraishi et al. |
| 5,418,743 A | 5/1995 | Tomioka et al. |
| 5,450,341 A | 9/1995 | Sawada et al. |
| 5,450,354 A | 9/1995 | Sawada et al. |
| 5,477,499 A | 12/1995 | Van Buskirk et al. |
| 5,508,968 A | 4/1996 | Collins et al. |
| 5,521,870 A | 5/1996 | Ishikawa |
| 5,537,358 A | 7/1996 | Fong |
| 5,544,116 A | 8/1996 | Chao et al. |
| 5,568,085 A | 10/1996 | Eitan et al. |
| 5,583,808 A | 12/1996 | Brahmbhatt |
| 5,627,790 A | 5/1997 | Golla et al. |
| 5,633,603 A | 5/1997 | Lee |
| 5,657,332 A | 8/1997 | Auclair et al. |
| 5,694,356 A | 12/1997 | Wong et al. |

(Continued)

FOREIGN PATENT DOCUMENTS

EP    0740307    10/1996

(Continued)

*Primary Examiner*—Hoai V. Ho
(74) *Attorney, Agent, or Firm*—Eitan Law Group

(57) ABSTRACT

A method includes changing a read reference level for reading a group of memory cells as a function of changes in a threshold voltage distribution of a different group of memory cells. The changing step includes determining a history read reference level for correct reading of at least one history cell, selecting a memory read reference level according to the first read reference level, and reading non-volatile memory array cells associated with the at least one history cell using the memory read reference level.

26 Claims, 5 Drawing Sheets

U.S. PATENT DOCUMENTS

| | | | |
|---|---|---|---|
| 5,712,815 | A | 1/1998 | Bill et al. |
| 5,717,632 | A | 2/1998 | Richart et al. |
| 5,748,534 | A | 5/1998 | Dunlap et al. |
| 5,754,475 | A | 5/1998 | Bill et al. |
| 5,768,193 | A | 6/1998 | Lee et al. |
| 5,771,197 | A | 6/1998 | Kim |
| 5,784,314 | A | 7/1998 | Sali et al. |
| 5,805,500 | A | 9/1998 | Campardo et al. |
| 5,812,456 | A | 9/1998 | Hull et al. |
| 5,828,601 | A | 10/1998 | Hollmer et al. |
| 5,841,700 | A | 11/1998 | Chang |
| 5,847,441 | A | 12/1998 | Cutter et al. |
| 5,867,429 | A | 2/1999 | Chen et al. |
| 5,886,927 | A | 3/1999 | Takeuchi |
| 5,936,888 | A | 8/1999 | Sugawara |
| 5,940,332 | A | 8/1999 | Artieri |
| 5,946,258 | A | 8/1999 | Evertt et al. |
| 5,949,728 | A | 9/1999 | Liu et al. |
| 5,969,993 | A | 10/1999 | Takeshima |
| 5,982,666 | A | 11/1999 | Campardo |
| 5,986,940 | A | 11/1999 | Atsumi et al. |
| 6,044,019 | A | 3/2000 | Cernea et al. |
| 6,044,022 | A | 3/2000 | Nachumovsky |
| 6,084,794 | A | 7/2000 | Lu et al. |
| 6,108,240 | A | 8/2000 | Lavi et al. |
| 6,118,692 | A | 9/2000 | Banks |
| 6,128,226 | A | 10/2000 | Eitan et al. |
| 6,134,156 | A | 10/2000 | Eitan |
| 6,147,904 | A | 11/2000 | Liron |
| 6,169,691 | B1 | 1/2001 | Pasotti et al. |
| 6,185,143 | B1 | 2/2001 | Perner et al. |
| 6,201,737 | B1 | 3/2001 | Hollmer et al. |
| 6,205,056 | B1 | 3/2001 | Pan et al. |
| 6,222,762 | B1 | 4/2001 | Guterman et al. |
| 6,233,180 | B1 | 5/2001 | Eitan et al. |
| 6,240,040 | B1 | 5/2001 | Akaogi et al. |
| 6,252,799 | B1 | 6/2001 | Liu et al. |
| 6,282,133 | B1 | 8/2001 | Nakagawa et al. |
| 6,285,589 | B1 | 9/2001 | Klajitanl |
| 6,331,950 | B1 | 12/2001 | Kuo et al. |
| 6,351,415 | B1 | 2/2002 | Kushnarenko |
| 6,438,035 | B2 * | 8/2002 | Yamamoto et al. .... 365/185.21 |
| 6,456,528 | B1 * | 9/2002 | Chen ..................... 365/185.03 |
| 6,469,929 | B1 | 10/2002 | Kushnarenko et al. |
| 6,469,935 | B2 | 10/2002 | Hayashi |
| 6,496,414 | B2 | 12/2002 | Kasa et al. |
| 6,510,082 | B1 | 1/2003 | Le et al. |
| 6,525,969 | B1 | 2/2003 | Kurihara et al. |
| 6,529,412 | B1 | 3/2003 | Chen et al. |
| 6,535,434 | B2 | 3/2003 | Maayan et al. |
| 6,574,139 | B2 | 6/2003 | Kurihara |
| 6,594,181 | B1 | 7/2003 | Yamada |
| 6,636,440 | B2 | 10/2003 | Maayan et al. |
| 6,639,837 | B2 | 10/2003 | Takano et al. |
| 6,639,849 | B2 * | 10/2003 | Takahashi et al. ...... 365/189.07 |
| 6,643,178 | B2 | 11/2003 | Kurihara |
| 6,650,568 | B2 | 11/2003 | Iijima |
| 6,912,160 | B2 * | 6/2005 | Yamada ................... 365/185.2 |
| 6,996,692 | B2 * | 2/2006 | Kouno ...................... 711/164 |
| 2002/0004878 | A1 | 1/2002 | Norman |
| 2002/0071313 | A1 | 6/2002 | Takano et al. |
| 2002/0132436 | A1 | 9/2002 | Eliyahu et al. |
| 2002/0191465 | A1 | 12/2002 | Maayan et al. |
| 2003/0117841 | A1 | 6/2003 | Yamashita |
| 2003/0117861 | A1 | 6/2003 | Maayan et al. |
| 2003/0142544 | A1 | 7/2003 | Maayan et al. |
| 2003/0208663 | A1 | 11/2003 | Van Buskirk et al. |
| 2003/0214844 | A1 | 11/2003 | Iijima |
| 2004/0008541 | A1 | 1/2004 | Maayan et al. |
| 2004/0012993 | A1 | 1/2004 | Kurihara |
| 2004/0013000 | A1 | 1/2004 | Toril |

FOREIGN PATENT DOCUMENTS

| | | |
|---|---|---|
| EP | 1126468 | 8/2001 |
| EP | 1164597 | 12/2001 |
| EP | 0656628 | 4/2003 |
| JP | 408106791 | 4/1996 |
| JP | 2002216488 | 8/2002 |
| WO | WO 00/46808 | 8/2000 |
| WO | WO 03/036651 | 5/2003 |
| WO | WO 03/063168 | 7/2003 |
| WO | WO 03/088261 | 10/2003 |

* cited by examiner

METHOD FOR READING NON-VOLATILE MEMORY CELLS

FIELD OF THE INVENTION

The present invention relates to non-volatile memory cells generally and to methods of reading them in particular.

BACKGROUND OF THE INVENTION

Dual bit memory cells are known in the art. One such memory cell is the NROM (nitride read only memory) cell 10, shown in FIG. 1 to which reference is now made, which stores two bits 12 and 14 in a nitride based layer 16 sandwiched between a conductive layer 18 and a channel 20. NROM cells are described in many patents, for example in U.S. Pat. No. 6,649,972, assigned to the common assignees of the present invention, whose disclosure is incorporated herein.

Bits 12 and 14 are individually accessible, and thus, may be programmed (conventionally noted as a '0'), erased (conventionally noted as a '1') or read separately. Reading a bit (12 or 14) involves determining if a threshold voltage $V_t$, as seen when reading the particular bit, is above (programmed) or below (erased) a read reference voltage level RD.

FIG. 2, to which reference is now made, illustrates the distribution of programmed and erased states of a memory chip (which typically has a large multiplicity of NROM cells formed into a memory array) as a function of threshold voltage $V_t$. An erased bit is one whose threshold voltage has been reduced below an erase threshold voltage EV. Thus, an erase distribution 30 has typically its rightmost point in the vicinity of (and preferably at or below) the erase threshold voltage EV. Similarly, a programmed bit is one whose threshold voltage has been increased above a program threshold voltage PV. Thus, a programmed distribution 32 has typically its leftmost point in the vicinity of (and preferably at or above) the program threshold voltage PV.

The difference between the two threshold voltages PV and EV is a window W0 of operation. Read reference voltage level RD is typically placed within window W0 and can be generated, as an example, from a read reference cell. The read reference cell is usually, but not necessarily, in a non-native state, as described in U.S. Pat. No. 6,490,204, assigned to the common assignee of the present invention, whose disclosure is incorporated herein by reference. In such case, the threshold voltage of read reference cell may be at the RD level in FIG. 2.

The signal from the bit being read is then compared with a comparison circuit (e.g. a differential sense amplifier) to the signal generated by the read reference level, and the result should determine if the array cell is in a programmed or erased state. Alternatively, instead of using a reference cell, the read reference signal can be an independently generated voltage or a current signal. Other methods to generate a read reference signal are known in the art.

Since the sensing scheme circuitry may not be perfect, and its characteristics may vary at different operating and environmental conditions, margins M0 and M1 are typically required to correctly read a '0' and a '1', respectively. As long as the programmed and erased distributions are beyond these margins, reliable reads may be achieved.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
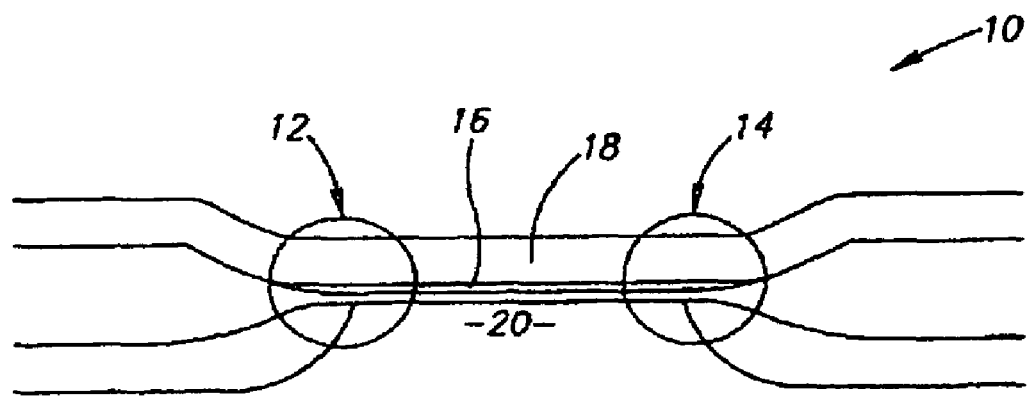
FIG. 1 is a schematic illustration of a prior art NROM cell.
Figure 2:
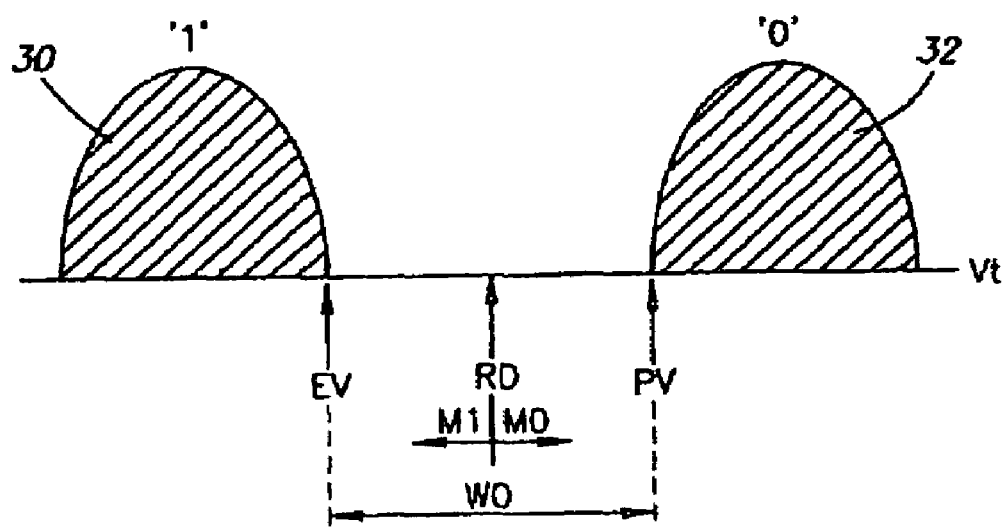
FIG. 2 is a schematic illustration of the distribution of programmed and erased states of a memory chip of NROM cells as a function of threshold voltage $V_t$.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicants have realized that the window of operation may change over time as the cells go through multiple erase and programming cycles. The window of operation may shrink and/or may drift, both of which may affect the accuracy of the read operation.

Figure 3:
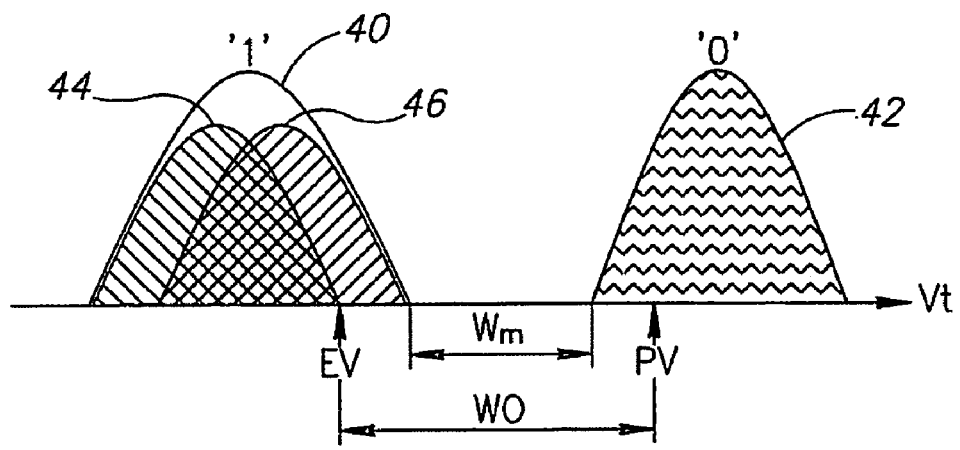
FIG. 3 is a schematic illustration of erase and programmed distributions at some point after the start of operation of an exemplary memory array.

Reference is now made to FIG. 3, which illustrates erase and programmed distributions 40 and 42, respectively, at some point after the start of operation of an exemplary memory array.

Although each bit may be erased to a threshold voltage below erase voltage EV, erase distribution 40 may appear to be shifted slightly above erase voltage EV. Applicants have realized that this may be due to the fact that the two bits of a cell have some effect on each other. If both bits are erased, then the threshold voltage of each bit may be below erase voltage EV (as indicated by the smaller distribution 44 within erase distribution 40). However, if one of the bits is programmed while the other bit is erased, the threshold voltage of the erased bit may appear higher, due to the programmed state of the other bit. This is indicated by the second small distribution 46 within erase distribution 40, some of whose bits may have threshold voltages that appear to be above erase voltage EV. This is typically referred as a "second bit effect".

Applicants have additionally realized that, after repeated program and erase cycles, programmed distribution 42 may shift below programming voltage PV. This may be due to charge redistribution within the trapping layer, aging characteristics, or retention properties of the cells after many erase/program cycles. This downward shift of the programmed distribution 42 is time and temperature dependent, and the shift rate also depends on the number of program/erase cycles that the cell has experienced in its past.

Figure 4:
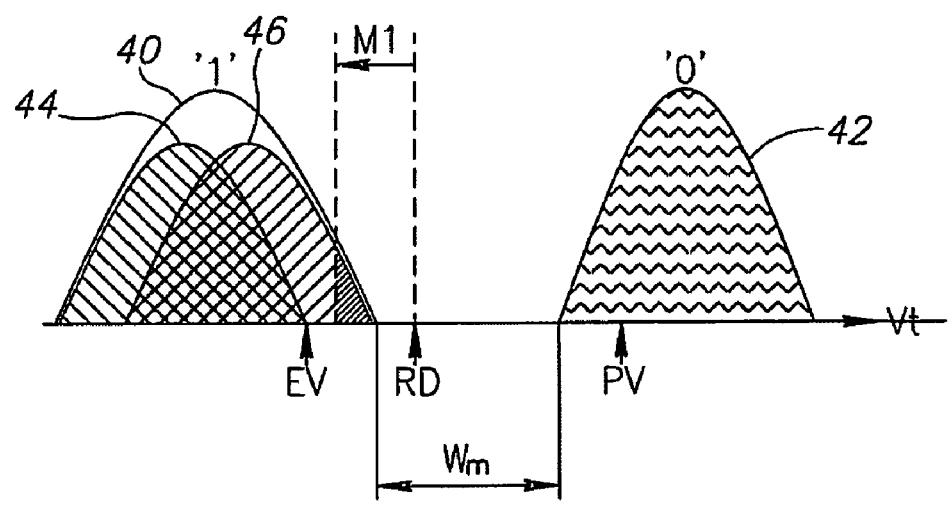
FIG. 4 is a schematic illustration of erase and programmed distributions once the distributions have shifted from those of FIG. 3.

The result of these shifting distributions may be to shrink the window of operation to a different window Wm of operation. Applicants have realized that the different window Wm may or may not be aligned with the original window W0. FIG. 3 shows an exemplary window Wm with its center shifted from the center of the original window W0. Applicants have realized that one or both of these changes may have an effect on the quality of the read operation. This is illustrated in FIG. 4, to which reference is now made.

As mentioned in the Background, a margin M1 may be required to compensate circuit deficiencies and to ensure a correct read of an erased bit. The original placement of the erased bits below the EV level (typically after an erase operation), provided a larger than M1 margin, and thus a reliable read of '1' bits. Unfortunately, as shown in FIG. 4, since erase distribution 40 may have drifted above erase threshold voltage EV, margin M1 may no longer be maintained. There may be some bits within erase distribution 46, indicated by solid markings, which may be wrongly read (i.e. read as programmed) since their threshold voltages are not below margin M1.

Figure 5A:
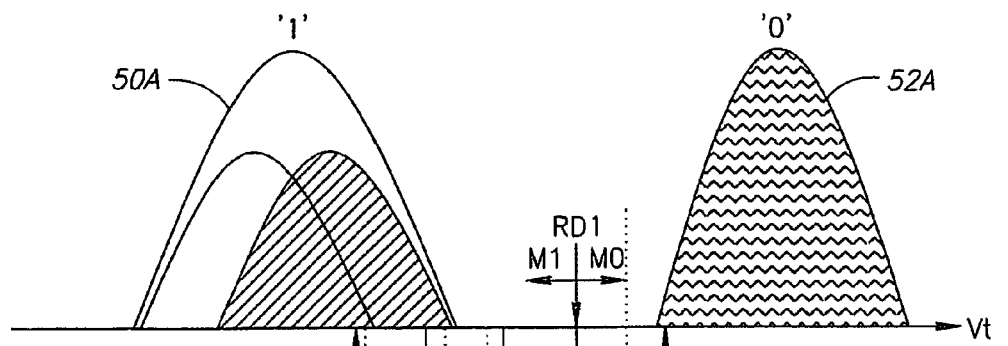
FIGS. 5A, 5B and 5C are schematic illustrations of a method of reading memory cells, constructed and operative in accordance with the present invention, using a moving read reference level which may move as a function of changes in the window of operation.
Figure 5B:
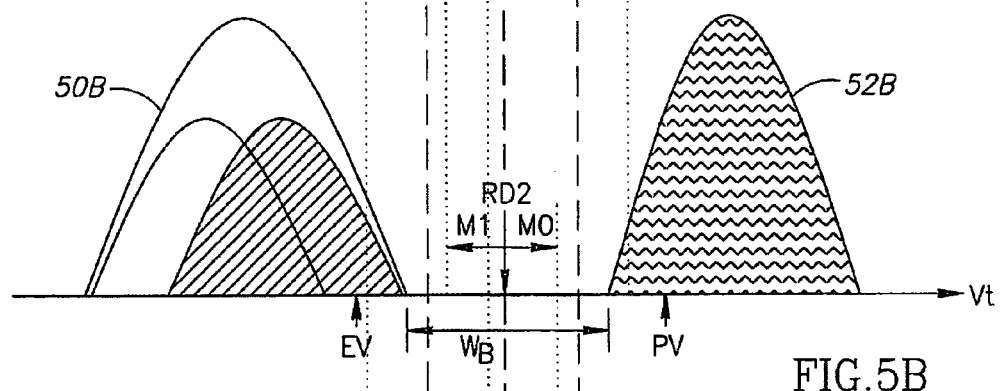
Figure 5C:
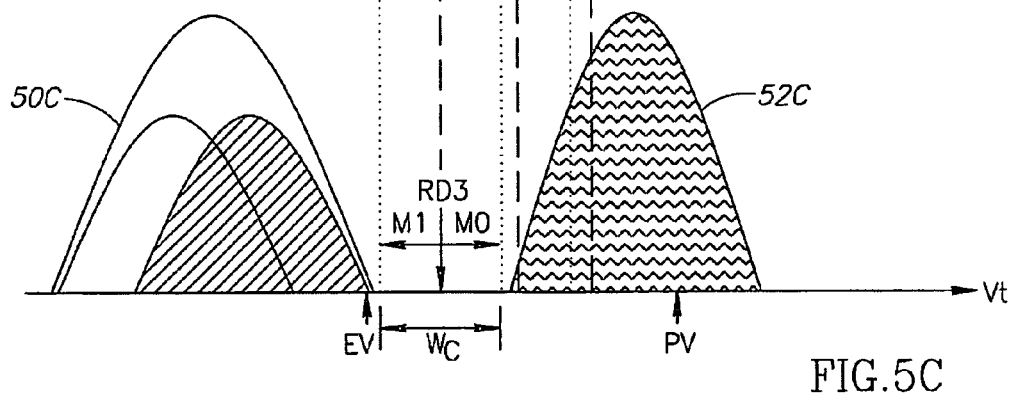

Reference is now made to FIGS. 5A, 5B and 5C, which together illustrate a method of reading memory cells, constructed and operative in accordance with the present invention, using a moving read reference level MRL, which may move as a function of changes in the window of operation.

In accordance with a preferred embodiment of the present invention, shortly after an erase and a program operation (FIG. 5A), moving read level MRL may be placed at a read level RD1 between an erase distribution 50A and a programmed distribution 52A, where erase distribution 50A is now slightly above erase threshold voltage EV (due to the second bit effect) and programmed distribution 52A is now entirely or almost entirely above programming threshold voltage PV. Suitable margins M1 and M0 may be defined from read level RD1 to overcome circuit and sensing scheme deficiencies and to ensure correct detection of the bit states. In FIG. 5A, the erase and program distributions are beyond margins M1 and M0, respectively. Therefore, at this point, read level RD1 may successfully and reliably read both 1's and 0's.

If the cells have already passed multiple programming and erase cycles, then, after a period of time, the distributions may shift. In FIG. 5B, the program distribution, now labeled 52B, has moved lower and thus, a significant part of it is below program threshold voltage PV. However, the erase distribution, here labeled 50B, has typically also moved lower. Even if the window of operation $W_B$ is close to or the same width as that in FIG. 5A (labeled $W_A$), its center has changed. As a result, read reference level RD1 with margin M0 may no longer correctly read all the bits in the program distribution 52B as '0'.

In accordance with a preferred embodiment of the present invention, for the situation of FIG. 5B, moving read level MRL may move to a second read level RD2. In this situation, when reading bits with reference to read level RD2, margins M0 and M1 are maintained, but relative to the shifted RD2 read level, and therefore all the bits in both distributions (50B and 52B) may be correctly read as erased ('1') or programmed ('0').

FIG. 5C shows a third case where the distributions may have shifted further, resulting in a window of operation $W_C$ that is further shrunk and/or shifted. In accordance with a preferred embodiment of the present invention, moving read level MRL may move to a third read level RD3 (along with margins M0 and M1) to accommodate the changed window of operation, and to ensure a reliable read of all the bits in the distributions 50C and 52C.

It will be appreciated that read levels RD1 and RD2 would not successfully read the distribution of FIG. 5C. Both read levels RD1 and RD2 would erroneously read at least some of the 0's (since the distance of the left side of the program distribution 52C to the read level is smaller than the required margin M0). Similarly, third read level RD3 would erroneously read some of the 1's had it been used for the distributions of FIGS. 5A and 5B since the right sides of distributions 50A and 50B do not maintain a required margin M1 from the read level RD3.

Figure 6A:
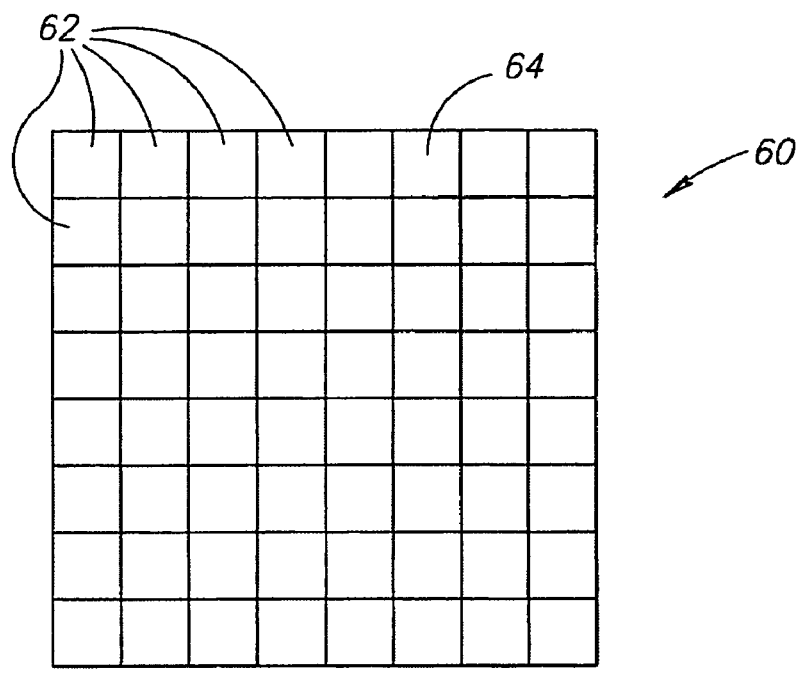
FIGS. 6A, 6B and 6C are schematic illustrations of alternative locations of history cells and memory cells, useful in implementing the method of FIGS. 5A, 5B and 5C.

Selecting which read level to utilize at any given time may be done in any suitable manner and all such methods are included in the present invention. An example is shown in FIG. 6A, to which reference is now made. In this example, the memory array, labeled 60, may comprise memory cells 62 to be read, and history cells 64. At least one history cell 64 may be associated with a subset of memory cells 62 and may pass through substantially the same events and preferably substantially at the same time and with the same conditions as its corresponding subset of memory cells 62.

Figure 6B:
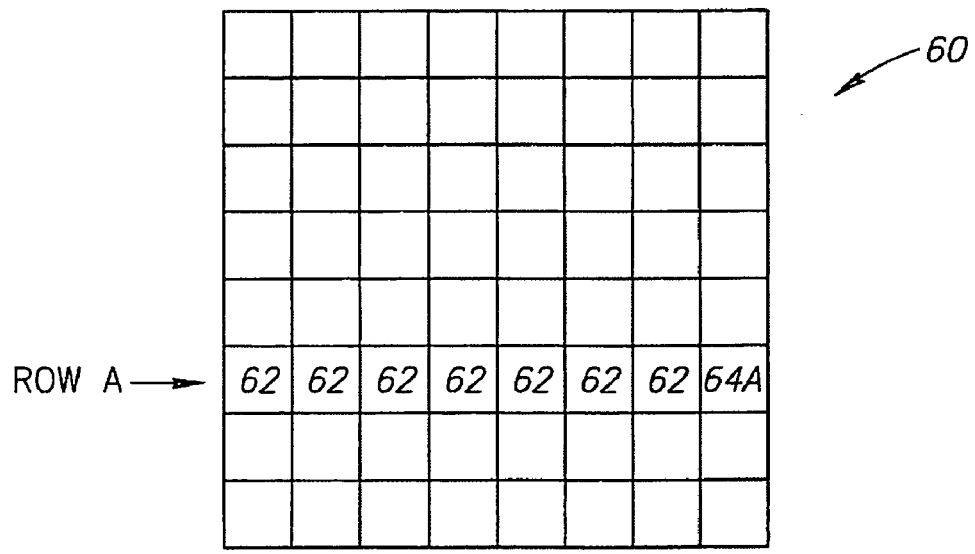

A specific example is shown in FIG. 6B, to which reference is now made. In this example, a history cell 64A may be associated with a row A of memory cells 62 and may be programmed and erased at the same time as cells 62 in row A, always being brought back to a its known predetermined state. This predetermined state may be, for example, such that both bits (i.e. both storage areas) of the cell are in a programmed state, or, in a different case, only one of the bits is in a programmed state while the other bit remains erased.

Figure 6C:
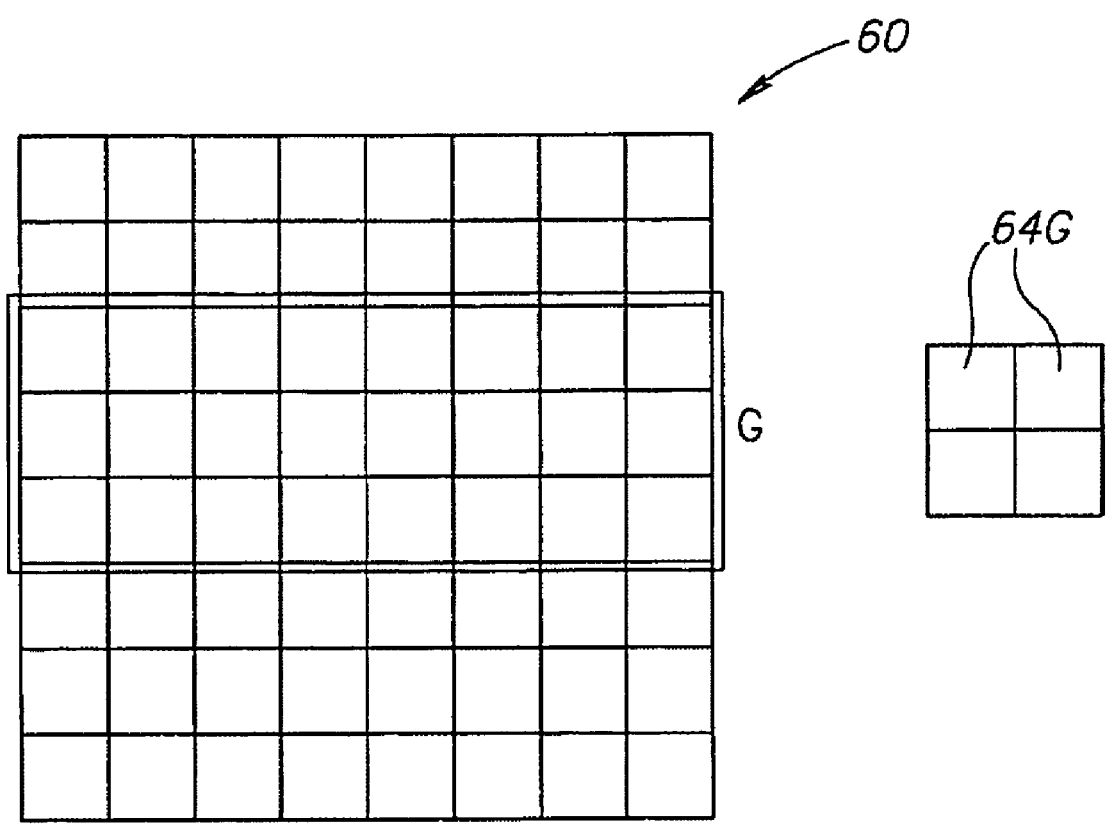

Another example is shown in FIG. 6C, to which reference is now made. In this example, a set of history cells 64G may be associated with a section G in array 60. History cells 64G may be anywhere in the memory array as long as they pass through substantially the same events at substantially the same conditions as the subset of memory cells with whom they are associated. The history cells 64G are always brought back to a predetermined state. Some of the history cells may have both bits (i.e. both storage areas) in a programmed state while other history cells may have only one of their bits in a programmed state.

The history cells 64 may be utilized to determine the most appropriate reference read level to use for reading the subset of memory cells 62 to which they are associated. The reference read level, or more preferably, the highest reference read level, that may produce a correct readout of history cells 64 (a '0' readout, since the history cells 64 typically are in a programmed state) may be utilized to read its associated subset of memory cells 62.

The reference read level used to correctly read history cell 64 may be known as a "history read reference level". The associated subset of memory cells 62 may be read with a "memory read reference level" which may be the same as the history read reference level or it may have a margin added to it.

In one example, there may be three available reference read levels RD1>RD2>RD3. If a programmed history cell 64 is incorrectly read using RD(j) (i.e. it is read as erased), but correctly read using RD(j+1), then the associated subset of memory cells 62 may preferably be read using the RD(j+1) reference read level, with or without a margin added to it.

Alternatively, if a programmed history cell 64 cannot be read with enough margin (Mh) using RD(j) (i.e. it is read as erased using RD(j)+Mh), but can be read with enough margin using RD(j+1) (i.e. it is read as programmed using RD(j+1)+Mh), then the associated subset of memory cells 62 may preferably be read using the RD(j+1) reference read level. The margin Mh may be defined as the amount of desired margin between the reliable readout of the history cell and the reliable readout of the memory cells 62 associated therewith.

The most appropriate reference read level to be used for reading each of the subsets of memory cells 62 may be determined in any one of a number of ways, of which four are described hereinbelow.

A) reading all or part of the history cells 64 vs. all or part of existing read reference cells having read reference levels RD(j).

B) reading all or part of the history cells 64 vs. specific reference cells placed at the read reference levels RD(j) plus some margin Mh. There can be separate margins Mh(j) for each read level RD(j).

C) reading all or part of the history cells 64 vs. all or part of the existing read reference cells having read reference levels RD(j) but activating the word lines of the history cells 64 at a different level than the word line of the read reference cells, in order to introduce some margin.

D) reading all or part of the history cells 64 vs. all or part of the existing read reference cells having read reference levels RD(j) but introducing some margin Mh(j) at each of these read operations, for example by adding or subtracting a current or voltage signal to the signals of at least one of the history or the read reference cells.

These operations may be performed "on the fly" (before reading the associated subset of memory cells 62) in applications that allow sufficient time to read the history cells 64 vs. the different read reference levels and to determine the optimal memory read reference level for reading the associated subset of memory cells 62. Alternatively, the history cells 64 may be read at predetermined times and, after analyzing the readouts and choosing the appropriate read reference level for each set of history cells, the results may be stored for later use when a read of memory cells 62 may be required. Such predetermined times may be at power-up of the device, prior to or after long operations (e.g. program or erase) or at idle times. The history cells 64 may be read serially, in parallel, and in a mixed serial/parallel form.

The history cells 64 may be of the same type of multi bit NROM cells as the array memory cells 62. They may be operated in a one bit per cell mode, in a dual bit per cell mode, or in a multilevel mode. The programmed state of history cells 64 may be achieved by programming only one or both bits in their cells. The history cells 64 may be erased close to, together with, or while erasing their associated memory cells 62. The programming of the history cells may be performed shortly after erasing them and their associated memory cells 62, or close to programming a subset of bits in their associated memory cells 62.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method comprising: determining a history read reference level for correct reading of at least one history cell; selecting a memory read reference level according to said history read reference level; and reading non-volatile memory array cells associated with said at least one history cell using said memory read reference level.

2. The method according to claim 1 wherein said determining comprises: having multiple history read reference levels; and reading said at least one history cell with at least one of said multiple history read reference levels.

3. The method according to claim 2 wherein said reading is performed on said multiple history read reference levels in one of the following ways: serially, in parallel, and in a mixed serial/parallel form.

4. The method according to claim 1 wherein said history read reference level is equal to said memory read reference level.

5. The method according to claim 1 wherein said history read reference level is not equal to said memory read reference level.

6. The method according to claim 5 wherein said non-equality depends on a predetermined margin to be maintained between readout of said at least one history cell and the readout of its associated said memory array cells.

7. The method according to claim 1 and also comprising having reed reference cells and activating word lines of said history cells at a different level than word lines of said read reference cells.

8. The method according to claim 1 and comprising having each said at least one history cell pass substantially the same events at substantially the same conditions as its said associated memory cells.

9. The method according to claim 1 and wherein said determining occurs at one of the following times: at power-up of a device implementing the method, prior to or after long operations, and at idle times.

10. The method according to claim 1 and wherein said history cells and said memory cells are NROM (nitride read only memory) cells.

11. The method according to claim 1 and wherein said history cells and said memory cells are NROM cells operated in one of the following modes: a one bit per cell mode, in a dual bit per cell mode, and in a multilevel mode.

12. The method according to claim 1 and also comprising erasing each said history cell and its said associated memory cells within a short time span of each other.

13. The method according to claim 1 and also comprising programming at least one of said history cell and at least one of its said associated memory cells within a short time span of each other.

14. A method comprising: changing a read reference level for reading a group of memory cells as a function of changes in a threshold voltage distribution of a different group of memory cells, determining a history read reference level for correct reading of at least one history cell according to said changing; selecting a memory read reference level according to said history read reference level; and reading non-volatile memory array cells associated with said at least one history cell using said memory read reference level.

15. The method according to claim 14 wherein said determining comprises: having multiple read reference levels; and reading said at least one history cell with at least one of said multiple read reference levels.

16. The method according to claim 15 wherein said reading is performed on said multiple history read reference levels in one of the following ways: serially, in parallel, and in a mixed serial/parallel form.

17. The method according to claim 14 wherein said history read reference level is equal to said memory read reference level.

18. The method according to claim 14 wherein said history read reference level is not equal to said memory read reference level.

19. The method according to claim 18 wherein said non-equality depends on a predetermined margin to be maintained between readout of said at least one history cell and the readout of its associated said memory array cells.

20. The method according to claim 14 and also comprising having read reference cells and activating word lines of said history cells at a different level than word lines of said read reference cells.

21. The method according to claim 14 and comprising having each said at least one history cell pass substantially the same events at substantially the same conditions as its said associated memory cells.

22. The method according to claim 14 and wherein said determining occurs at one of the following times: at power-up of a device implementing the method, prior to or after long operations, and at idle times.

23. The method according to claim 14 and wherein said history cells and said memory cells are NROM cells.

24. The method according to claim 14 and wherein said history cells and said memory cells are NROM cells operated one of the following modes: in a one bit per cell mode, in a dual bit per cell mode, and in a multilevel mode.

25. The method according to claim 14 and also comprising erasing each said history cell and its said associated memory cells within a short time span of each other.

26. The method according to claim 14 and also comprising programming at least one of said history cell and at least one of its said associated memory cells within a short time span of each other.

* * * * *